(12) United States Patent
Pickerd

(10) Patent No.: US 6,459,256 B1
(45) Date of Patent: Oct. 1, 2002

(54) DIGITAL STORAGE OSCILLOSCOPE

(75) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/634,924

(22) Filed: Aug. 8, 2000

Related U.S. Application Data

(60) Provisional application No. 60/205,800, filed on May 17, 2000.

(51) Int. Cl.⁷ .............................................. G01R 13/20
(52) U.S. Cl. ................................................. 324/121 R
(58) Field of Search ........................... 324/76.11, 121 R, 324/753, 76.19; 702/66, 67; 345/440.1

(56) References Cited

U.S. PATENT DOCUMENTS 5,877,621 A * 3/1999 Beyers et al. ................. 702/66
5,914,592 A * 6/1999 Saito ............................ 702/67
5,978,742 A * 11/1999 Pickerd ..................... 324/121 R

* cited by examiner

Primary Examiner—N. Le
Assistant Examiner—James Kerveros
(74) Attorney, Agent, or Firm—John Smith-Hill; Thomas F. Lenihan

(57) ABSTRACT

A digital storage oscilloscope includes first and second memory modules each including a data input section for receiving an input stream of digital data words and generating a sequence of address words, an acquisition memory which is addressed utilizing the address words for storing the data words, and a trigger input section for receiving a discrete input trigger and supplying the discrete input trigger to the data input section for initiating termination of an acquisition. The data input section of the first memory module passes the stream of digital data words to the data input section of the second memory module and supplies a discrete trigger to the trigger input section of the second memory module.

6 Claims, 2 Drawing Sheets

DIGITAL STORAGE OSCILLOSCOPE

CROSS REFERENCE TO RELATED APPLICATIONS

The subject application hereby claims priority from U.S. Provisional patent Application Ser. No. 60/205,800, entitled EXPANDABLE STREAMING ACQUISITION MEMORY ARCHITECTURE, filed May 17, 2000 in the name of John J. Pickerd.

BACKGROUND OF THE INVENTION

This invention relates to a digital storage oscilloscope.

The acquisition section of a conventional storage oscilloscope includes several components that are relatively expensive and are highly adapted to the environment in which they are used. The specialized nature of the components makes it difficult to expand the capabilities of the acquisition section, especially with regard to engineering cost. For example, the stream of digital data words generated by the analog-to-digital converter, perhaps operating at a rate as high as 1 Gs/s, cannot be loaded into successive addresses of the acquisition memory as a single stream because of the high sample rate, but must be supplied to the memory through a demultiplexer. The demultiplexer loads a block of data words into an accumulation register and the block of data words is then loaded into the acquisition memory in a single write operation. By proceeding in this way, the write operation occurs at a frequency that is substantially less than the sample rate. The demultiplexer itself generates the address words that are used for writing the data words into the memories.

The blocks of data words are written into the acquisition memory in a circular manner until the demultiplexer receives a trigger to initiate termination of the acquisition. After the demultiplexer receives a trigger, the demultiplexer continues to write data words into the acquisition memory until a prescribed quantity of post-trigger data has been acquired and at that point the demultiplexer ceases writing data into the acquisition memory. An external processor reads the waveform data from the acquisition memory as the next step of the operation of generating a waveform display.

After the data has been read out, the acquisition memory can be armed again and data is written into the memory until the next trigger is received.

The length of the waveform record that can be acquired depends on the number of address lines that the demultiplexer can control. This results in the maximum record length being smaller than is desired for some applications. The maximum record length cannot be increased, within this conventional architecture, without redesigning the demultiplexer, which is a difficult and expensive proposition.

SUMMARY OF THE INVENTION

According to a first aspect of the present invention there is provided a digital storage oscilloscope which includes first and second memory modules each including a data input section for receiving an input stream of digital data words and generating a sequence of address words, an acquisition memory which is addressed utilizing the address words for storing the data words, and a trigger input section for receiving a discrete input trigger and supplying the discrete input trigger to the data input section for initiating termination of an acquisition, and wherein the data input section of the first memory module passes the stream of digital data words to the data input section of the second memory module and supplies a discrete trigger to the trigger input section of the second memory module.

According to a second aspect of the present invention there is provided a memory module for a digital storage oscilloscope, the memory module including a data input section for receiving an input stream of digital data words and generating a sequence of address words, an acquisition memory which is addressed utilizing the address words generated by the data input section for storing the data words, a trigger input section for receiving a discrete input trigger and supplying the discrete input trigger to the data input section for initiating termination of an acquisition, and a trigger output section for generating a discrete output trigger when the acquisition memory is full.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
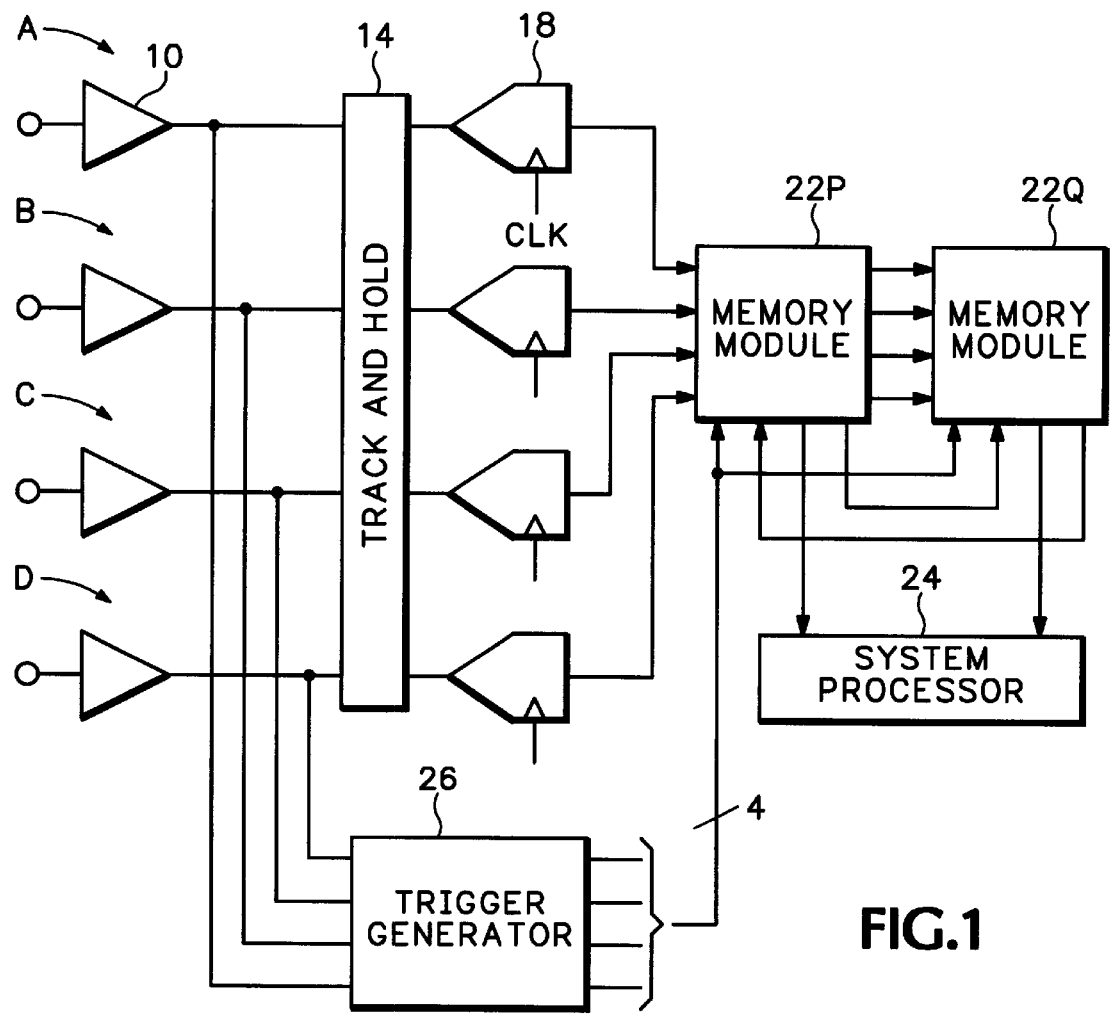
FIG. 1 is a schematic block diagram of an oscilloscope in accordance with the present invention.

The oscilloscope shown in FIG. 1 has four channels A–D, allowing it to acquire up to four input signals. Each channel includes a preamplifier 10 having an input terminal which is connected to a test point of a device under test. The output signals of the preamplifiers 10 are supplied to a track and hold 14, as is conventional, and the outputs of the track and hold 14 are supplied to analog-to-digital converters (ADC) 18. Each ADC 18 generates a stream of parallel digital data words under control of a sampling clock CLK. The four streams of digital data words generated by the four ADCs 18 respectively are supplied to respective data inputs of a first memory module 22P. The memory module 22P has four data outputs connected to respective data inputs of a second memory module 22Q. The two memory modules are identical.

A system processor 24 provides an interface between the memory modules 22 and user controls (not shown) and a display (not shown).

The oscilloscope also includes a trigger generator 26. As shown, the trigger generator 26 has four channels with respective input terminals connected to the outputs of the four preamplifiers 10 respectively. The trigger generator may have more or fewer than four channels, and the input signals that are supplied to the channels of the trigger generator need not be the analog output signals of the preamplifiers, as will be explained in further detail below.

Each channel of the trigger generator 26 compares its input signal with a trigger event (which may or may not be the same for each channel) and generates a discrete trigger (a single edge) when the trigger event occurs in its input signal. The trigger is supplied to the memory module 22P.

Figure 2:
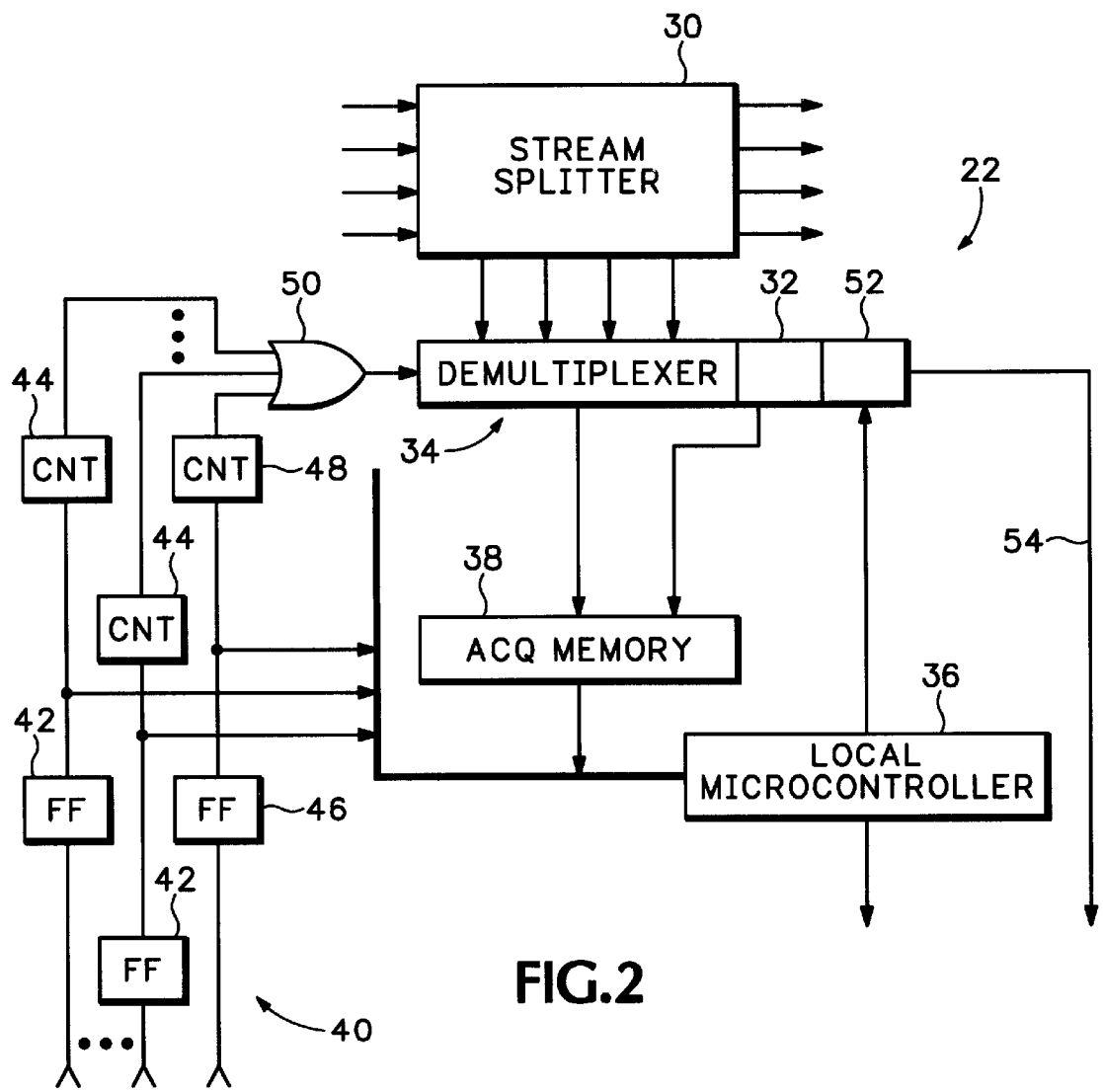
FIG. 2 is a more detailed block diagram of a memory module forming part of the oscilloscope shown in FIG. 1.

Referring to FIG. 2, each memory module 22 includes a stream splitter 30 having four data inputs constituting the data inputs of the memory module. The stream splitter has four primary data outputs constituting the data outputs of the memory module and has four secondary data outputs which are connected to respective inputs of a demultiplexer 34. The data stream supplied to a given data input of the stream splitter is supplied to the corresponding primary and secondary data outputs.

The memory module 20, which also includes a local microcontroller 36, has an enabled state and a disabled state. When the memory module is in its enabled state, the demultiplexer 34 responds to a command from the local microcontroller 36 by selecting one or more of the secondary data outputs from the stream splitter 30. The demultiplexer loads a block of data words of the stream(s) provided by the selected output(s) into a register, and the block of data words is then written to the acquisition memory 38 in a single write operation. The demultiplexer generates the address words that are used for addressing the acquisition memory.

The memory module also includes a trigger receiver 40 which has four main channels each including a flip-flop 42, which generates a trigger pulse in response to a trigger edge, and a delay counter 44 for delaying the trigger pulse by a selected amount, as will be described. The trigger receiver 40 also has an auxiliary channel including a flip-flop 46 and a delay counter 48. The outputs of the delay counters are connected to an OR gate 50, which supplies the delayed trigger pulse to the demultiplexer 34.

The output of the OR gate 50 is also connected (not shown) to the flip-flops 42. When the OR gate supplies a delayed trigger to the demultiplexer, it also inhibits the flip-flops 42 from responding to another trigger edge until they are armed by the microcontroller 36P.

The demultiplexer 34 includes control logic 32 which receives commands from the local microcontroller 36 and controls the state of the acquisition memory 38. The demultiplexer 34 also includes a trigger generator 52 having a trigger output 54.

The outputs of the flip flops 44 and 48 are connected to the data bus of the microcontroller 36. Accordingly, the flip-flops provide the microcontroller with information regarding the time of occurrence of a trigger event and the source of a trigger event.

In the following discussion, the suffixes P and Q are applied to numerals associated with components of a memory module to refer to the corresponding components of the modules 22P and 22Q respectively.

Referring again to FIG. 1, the primary data outputs of the stream splitter 30P are supplied to respective data inputs of the stream splitter 30Q and the trigger output 54P is connected to the auxiliary channel of the trigger receiver 40Q. The main channels of the trigger receiver 40Q are not used.

Let us assume that only channel A of the oscilloscope is being used so that a single stream of data words is supplied to the memory module 22P. Since only channel A of the oscilloscope is active, the preamplifiers 10 of channels B–D do not provide signals from which triggers can be generated. Let us further assume that the amount of pretrigger data specified by the user plus the amount of post-trigger data specified by the user is less than the capacity of the acquisition memory of one memory module.

The system processor 24 provides commands to the memory modules 22 and the local microcontrollers 36 initialize the control logic 32 and the acquisition memories 38 of the respective memory modules to execute an acquisition. The control logic 32P enables the memory module 22P and the control logic 32Q enables the memory module 22Q. The stream splitters 30 supply the stream of data words to the demultiplexers 34, which load blocks of data words into the acquisition memories 38 at successive addresses. After the specified amount of pretrigger data has been received, the microcontroller 36P arms the trigger receiver 40P, which then awaits occurrence of a trigger event. The blocks of data words are written into the memories 38 in circular fashion, so that the address wraps around to the beginning of the address range of the memory 38 if no trigger is received before the acquisition memory 38 is full.

When a trigger event occurs, the trigger generator 26 supplies a trigger edge to one of the flip-flops 42P, which generates a trigger pulse. The trigger pulse is delayed by the appropriate delay counter 44P and the delayed trigger pulse is supplied to the demultiplexer 34P. The flip-flops 42P are inhibited. The register states of the demultiplexer are saved and are provided to the microcontroller 36P, which is then able to calculate the address in the acquisition memory 38P of the data block that contains the trigger event. The memory module 22P continues to accept and store data words until the address generated by the demultiplexer 34P reaches the end of the address range of the acquisition memory 38P, whereupon instead of wrapping around to the beginning of the address range, the control logic 32P disables the memory module 22P and causes the trigger generator 52P to generate a trigger edge which it supplies to the auxiliary channel of the trigger receiver 40Q of the memory module 22Q. The control logic 32Q does not disable the memory module 22Q. On the contrary, the demultiplexer 34Q continues to accept data words and load them into the acquisition memory 38Q until the specified quantity of post-trigger data has been stored, at which time the acquisition ends and the control logic 32Q disables the memory module 22Q.

When the acquisition ends, the two acquisition memories 38P and 38Q contain data representing respective segments of the waveform during an acquisition interval that includes the trigger event. The local microcontrollers read out the blocks of data words from the acquisition memories and supply them to the system processor 24, which combines them to form a single waveform record for display. After the blocks of data words have been read from the acquisition memories, the system processor enables the memory modules 22P and 22Q for the next acquisition.

The cable lengths to the inputs of the four channels of the trigger generator 26 might be such that the signal propagation time difference over the four channels exceeds one period of the sampling clock. The delay counters 44 are programmed having regard to signal propagation time to the respective flip flops 42 for selectively delaying a trigger pulse derived from a particular source so that the trigger pulse received by the memory module is properly aligned with the data word to which it relates. Further, the propagation time from the data output of the memory module 22P to the data input of the memory module 22Q might exceed the sample period of the data. In order to ensure that the different segments of the waveform are properly positioned in time, without gaps or overlaps, the delay counter 48 is adjusted so that the trigger pulse received by the demultiplexer 34Q is properly positioned in time with respect to the first data word of the segment to be stored in the memory module 22Q.

The architecture of the memory module allows numerous refinements of the mode of operation described above. For example, if the quantity of post-trigger data should exceed the capacity of one memory module but the combined quantity of pre-trigger data and post-trigger data not exceed the combined capacities of two memory modules, the trigger generator 52Q generates a trigger edge when the memory 38Q is full and this trigger edge is fed back to the auxiliary trigger channel of the memory module 22P and the demultiplexer 34P completes the acquisition by loading the acquisition memory 38P until the specified quantity of post-trigger data has been stored. Since the combined quantity of pre-trigger and post-trigger data does not exceed the combined capacity of the two memory modules, there is no danger of the post-trigger data overwriting the pre-trigger data.

As described above, the two memory modules 22P and 22Q are connected together in daisy chain fashion. Although the oscilloscope shown in FIG. 1 includes only two memory modules, the architecture of the memory module lends itself to an indefinite number of modules being connected together, without being limited by the functional capacity of the demultiplexer 34 or acquisition memory 38. The capacity of the demultiplexer and the capacity of the acquisition memory are the same regardless of whether the oscilloscope employs two memory modules or 22 memory modules.

Each memory module is built on a printed circuit board which can be inserted into the back plane of a standard rack mount unit. In the case of an oscilloscope including only two memory modules, as shown in FIG. 1, the two circuit boards can be inserted into the back plane of the same rack mount unit and suitable connections can be made between the memory modules within the rack mount unit. If the number of memory modules should exceed the capacity of a single rack mount unit, the additional memory modules can be inserted in further rack mount units and the trigger output of the last memory module in a given rack mount unit can be supplied to the auxiliary trigger channel of the first memory module of another rack mount unit.

For the sake of simplicity, the architecture of the memory module has been described with reference to an example in which only one input data stream is received. Should more than one input data stream be received, the data streams may be interleaved, so that successive data words in the blocks loaded into the acquisition memory are derived from different respective data streams. After the acquisition is complete, the system processor decomposes the data read from the acquisition memories to form the appropriate number of waveform records.

As suggested above, the trigger generator need not be configured so that each channel of the trigger generator monitors the analog output signal of the preamplifier in the corresponding channel of the oscilloscope. For example, in the case of only channel A of the oscilloscope being active, the four channels of the trigger generator 26 may define different respective trigger events and all be connected to the output of the preamplifier of channel A. Alternatively, one or more channels of the trigger generator may monitor a signal in the digital domain, downstream of the ADC 18 in the channel of the signal under observation. The digital signal may be monitored at a location downstream of one or more of the memory modules 22. The signal that is monitored need not be simply a replica (analog or digital) of the output signal of the preamplifier, but it may be a signal that has been processed, in the analog or digital domain, to emphasize a characteristic of interest. In the event that channel B, for example, of the oscilloscope is active in addition to channel A, one or more channels of the trigger generator could monitor the signal in channel B, either upstream or downstream of the ADC of that channel. One or more of the trigger channels may monitor a signal that reflects evolution of a variable that is not being observed by the oscilloscope.

It will be appreciated that the invention is not restricted to the particular embodiment that has been described, and that variations may be made therein without departing from the scope of the invention as defined in the appended claims and equivalents thereof Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated.

What is claimed is:

1. A digital storage oscilloscope, comprising:
    an acquisition unit for acquiring samples of a signal under test;
    at least first and second memory modules for storing said samples;
    a first data bus for conveying said samples to said first memory module;
    said first and second memory modules each including:
        a stream splitter having an input for receiving an input stream of digital data words, a first output for passing said stream of digital data words to a stream splitter of said second memory module via a second data bus, and a second output;
        a demultiplexer for receiving said stream of digital data words from said second output of said stream splitter, generating a sequence of address words, and developing a representation of said digital data words at an output;
        an acquisition memory which is addressed utilizing the address words for storing said representation of said digital data words; and
        a trigger input section for receiving a discrete input trigger and supplying the discrete input trigger to said demultiplexer to prevent overwriting of said stored representation of digital data words;
    and wherein said first memory module supplies a discrete trigger to the trigger input section of the second memory module when said acquisition memory of said first memory module has reached its data storage capacity.

2. A digital storage oscilloscope according to claim 1, wherein the trigger input section has a plurality of channels, and the trigger input section has an armed state in which it supplies a discrete input trigger to the data input section in response to receipt of discrete input trigger by one of its channels, and an inhibited state in which it does not supply a discrete input trigger to the data input section in response to receipt of a discrete input trigger by any of its channels, and wherein the trigger input section changes from its armed state to its inhibited state in response to receipt of a discrete input trigger by one of its channels.

3. A digital storage oscilloscope according to claim 2, wherein each channel of the trigger input section includes a controllable delay element for selectively delaying supply of a discrete input trigger to the data input section.

4. A digital storage oscilloscope according to claim 1, including a controllable delay means for selectively delaying supply of a discrete input trigger to the data input section.

5. A digital storage oscilloscope according to claim 1, wherein each memory module includes a local microcontroller for controlling operation of the data input section.

6. A digital storage oscilloscope according to claim 5, further including a system processor for controlling operation of the memory modules, and wherein the local microcontrollers of the first and second memory modules interface with the system processor.

* * * * *